(12) United States Patent
Nam et al.

(10) Patent No.: US 8,578,315 B2
(45) Date of Patent: Nov. 5, 2013

(54) SCHEDULING FOR PARALLEL PROCESSING OF REGIONALLY-CONSTRAINED PLACEMENT PROBLEM

(75) Inventors: Gi-Joon Nam, Austin, TX (US); Shyam Ramji, Lagrangeville, NY (US); Taraneh Taghavi, San Diego, CA (US); Paul G. Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/550,957

(22) Filed: Jul. 17, 2012

(65) Prior Publication Data

US 2012/0284733 A1 Nov. 8, 2012

Related U.S. Application Data

(62) Division of application No. 12/359,369, filed on Jan. 26, 2009, now Pat. No. 8,245,173.

(51) Int. Cl.
*G06F 17/50* (2006.01)

(52) U.S. Cl.
USPC .......................................... 716/122; 716/123

(58) Field of Classification Search
USPC ................................................ 716/118–125
See application file for complete search history.

(56) References Cited

U.S. PATENT DOCUMENTS

| | | | |
|---|---|---|---|
| 5,636,132 A | 6/1997 | Kamdar | |
| 5,818,729 A | 10/1998 | Wang et al. | |
| 6,080,201 A | 6/2000 | Hojat et al. | |
| 6,606,737 B1 | 8/2003 | Zahar | |
| 6,671,867 B2 | 12/2003 | Alpert et al. | |
| 6,757,878 B2 | 6/2004 | Srinivasan et al. | |
| 6,948,143 B2 | 9/2005 | Donelly et al. | |
| 7,467,369 B2 | 12/2008 | Alpert et al. | |
| 7,904,840 B2 | 3/2011 | Tang | |
| 7,934,188 B2 | 4/2011 | Alpert et al. | |
| 2003/0208723 A1* | 11/2003 | Killian et al. | 716/1 |
| 2006/0259889 A1* | 11/2006 | Crosetto | 716/10 |
| 2007/0234257 A1 | 10/2007 | Pandey et al. | |
| 2008/0276212 A1 | 11/2008 | Albrecht | |
| 2009/0271752 A1 | 10/2009 | Alpert et al. | |
| 2010/0192155 A1 | 7/2010 | Nam et al. | |

OTHER PUBLICATIONS

USPTO U.S. Appl. No. 12/359,369.
Korf, Richard, "A Complete Anytime Algorithm for Number Partitioning", Artificial Intelligence, v. 106, iss. 2, (1998), pp. 181-203.

* cited by examiner

*Primary Examiner* — Binh Tat
(74) *Attorney, Agent, or Firm* — Stephen J. Walder, Jr.; Eustus D. Nelson

(57) ABSTRACT

Scheduling of parallel processing for regionally-constrained object placement selects between different balancing schemes. For a small number of movebounds, computations are assigned by balancing the placeable objects. For a small number of objects per movebound, computations are assigned by balancing the movebounds. If there are large numbers of movebounds and objects per movebound, both objects and movebounds are balanced amongst the processors. For object balancing, movebounds are assigned to a processor until an amortized number of objects for the processor exceeds a first limit above an ideal number, or the next movebound would raise the amortized number of objects above a second, greater limit. For object and movebound balancing, movebounds are sorted into descending order, then assigned in the descending order to host processors in successive rounds while reversing the processor order after each round. The invention provides a schedule in polynomial-time while retaining high quality of results.

7 Claims, 6 Drawing Sheets

SCHEDULING FOR PARALLEL PROCESSING OF REGIONALLY-CONSTRAINED PLACEMENT PROBLEM

This application is a divisional of application Ser. No. 12/359,369, filed Jan. 26, 2009, now U.S. Pat. No. 8,245,173.

BACKGROUND OF THE INVENTION

1. Field of the Invention

The present invention generally relates to scheduling of computational loads in a multiprocessor computer system, and more particularly to a method of assigning computational loads associated with multiple regions having placeable objects for the physical design of an integrated circuit.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and requires connections between the cells. A cell is a group of one or more circuit elements such as transistors, capacitors, resistors, inductors, and other basic circuit elements combined to perform a logic function. Cell types include, for example, core cells, scan cells, input/output (I/O) cells, and memory (storage) cells.

An IC chip is fabricated by first conceiving the logical circuit description, and then converting that logical description into a physical description, or geometric layout. This process is usually carried out using a "netlist," which is a record of all of the nets, or interconnections, between the cell pins, including information about the various components such as transistors, resistors and capacitors. A layout typically consists of a set of planar geometric shapes in several layers. The layout is then checked to ensure that it meets all of the design requirements, particularly timing requirements. The process of converting the specifications of an electrical circuit into such a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn-around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Recent years have seen the emergence of several new academic placement tools, especially in the top-down partitioning and analytical domains. Analytical placers optimally solve a relaxed placement formulation, such as minimizing total quadratic wire length. Quadratic placers generally use various numerical optimization techniques to solve a linear system. Two popular techniques are known as conjugate gradient (CG) and successive over-relaxation (SOR). The PROUD placer uses the SOR technique, while the GORDIAN placer employs the CG algorithm.

VLSI placement has been researched for more than three decades, but the problem remains challenging for multiple reasons. Foremost, the scaling of technology and the corresponding increase in circuit density have allowed only scalable placement techniques a viable option in modern chip designs. Due to this complexity increase in modern chips such as application-specific integrated circuits (ASICs), a more hierarchical design methodology has been adopted in design flow simply to reduce the layout turn-around time. Such complex designs are composed based on the logic or function hierarchy. Each hierarchical module is synthesized, placed and routed individually, then later combined together at the top level to complete the full chip. However, placement based on the logic hierarchy may lead to considerably inferior results.

A preferred methodology is to place the entire design flat (or virtually flat) to derive a good physical hierarchy and use it to guide the subsequent physical synthesis process. Region constraint (RC) placement is derived in such a design layout flow. The region constraint in a placement is an artificial constraint, usually dictated by designers, that a certain set of objects (cells or circuit elements) must be placed in a pre-defined layout area. The region constraints can be determined by logical partitioning in a hierarchical design methodology, or can be defined from electrical constraints such as voltage or clock domains.

Another trend in EDA is the parallelization of CAD algorithms. With the advent of multi-core (multi-processor) systems, many CAD algorithms have been retooled in parallel fashion to take advantage of these advanced hardware systems. Unfortunately the layout process, particularly placement, is one of the areas where parallelization efforts have not been successful thus far. One of the key issues in parallelization of an algorithm is load balancing of tasks (also known as scheduling). While general load balancing has been well-researched in the distributed computing area, the problem of parallel processing of regionally-constrained placement remains unsolved. This problem is furthermore growing as ever larger numbers of constraint regions (movebounds) are being defined in state-of-the-art chips with millions of gates, leading to significantly worse runtimes.

In light of the foregoing, it would be desirable to devise an improved method for parallelization of regionally-constrained placement which could more efficiently utilize the hardware resources of multi-core systems to decrease placement turn-around time. It would be further advantageous if the method could achieve such efficient placement without degrading the quality of results, for example, in terms of total wirelength.

SUMMARY OF THE INVENTION

It is therefore one object of the present invention to provide an improved method for parallel processing of regionally-constrained object placement in the design of an integrated circuit.

It is another object of the present invention to provide such a method which reduces overall turn-around time for a placement having very large numbers of movebounds and placeable objects.

It is yet another object of the present invention to provide such a method which retains high quality of results in the ensuing circuit layout.

The foregoing objects are achieved in a method of scheduling regionally-constrained placement processing which at the highest level selects between different balancing schemes according to the particular object and movebound characteristics of the integrated circuit design. If there are a relatively small number of movebounds, placement computations are assigned by balancing the placeable objects amongst host processors of the computer system without regard to the movebounds. If there are a large number of movebounds but the average number of objects per movebound is relatively small, placement computations are assigned by balancing the movebounds amongst the host processors without regard to the placeable objects. If there are a large number of movebounds and a large average number of objects per movebounds, placement computations are assigned by balancing both the objects and the movebounds amongst the host processors.

For movebound balancing, computational loads for the movebounds are assigned to a given processor until the number of movebounds for that processor is equal to or greater than the total number of movebounds in the design divided by the total number of processors in the computer system. For object balancing, computational loads for the movebounds may be successively assigned to a given processor until either an amortized number of objects for the given processor exceeds a first limit above an ideal number of objects per processor (e.g., 20%), or the next movebound assignment to the given processor would cause the amortized number of objects to exceed a second limit above the ideal number of objects per processor (e.g., 70%). Object balancing may adaptively update the ideal number of objects per processor after each iteration of assignments, by dividing the number of remaining objects in unassigned movebounds by the number of available processors not yet having movebound assignments. For combined object and movebound balancing, computational loads for the movebounds may be assigned by first sorting the movebounds into descending order based on the number of placeable objects associated with each movebound, then assigning the movebounds in the descending order to host processors in successive rounds while flipping the processor order after each round, i.e., movebounds are assigned in odd-numbered rounds according to a first processor order and are assigned in even-numbered rounds according to a second processor order which is the reverse of the first processor order. Object and movebound balancing may adaptively remove a given host processor from further assignment if the number of objects assigned to the given host processor is greater than an expected object load, and the number of movebounds assigned to the given host processor is greater than an ideal number of regions per processor less an offset value. The expected object load and the ideal number of regions per processor are updated after any host processor is removed.

Movebound assignments may be further refined by swapping a first movebound assigned to a first host processor with a second movebound assigned to a second host processor when the first host processor has a first object load which is greater than a second object load of the second host processor, the first movebound has more placeable objects than the second movebound, and the absolute difference between the number of placeable objects in the first movebound and the second movebound is less than a predetermined factor (e.g., ½) of the absolute difference between the first object load and the second object load.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
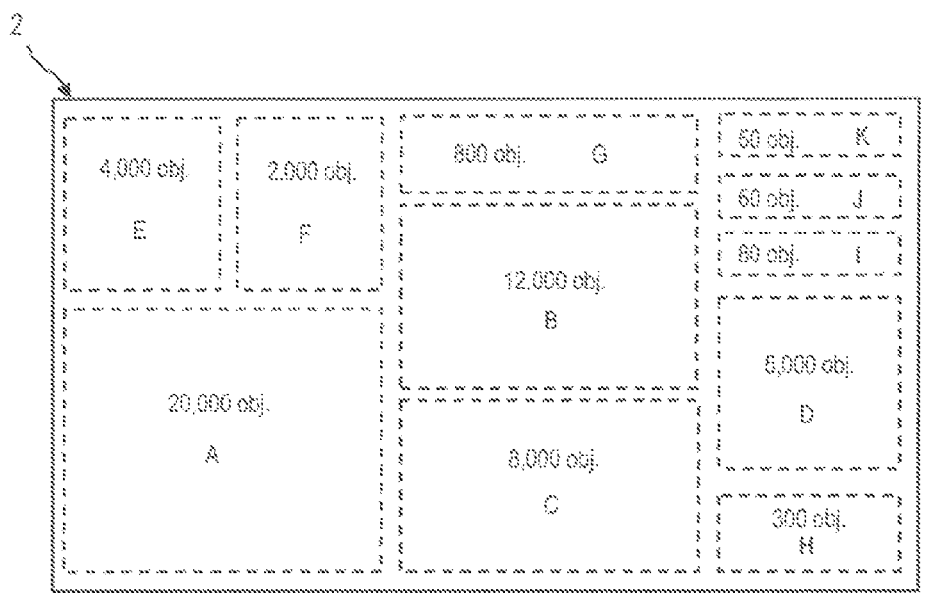
FIG. 1 is a plan view of a layout for one example of an integrated circuit design area divided into multiple constraint regions which contain placeable objects.

With reference now to the figures, and in particular with reference to FIG. 1, the present invention is directed to a scheduling technique which assigns computational loads for different constraint regions to different processors of a multiprocessor system. FIG. 1 illustrates an integrated circuit chip area 2 which has been divided into eleven such placement regions as indicated by dashed rectangles with various numbers of objects to be placed within each respective region, ranging from a minimum of 60 objects in one region to a maximum of 20,000 objects in another region. Those skilled in the art understand that FIG. 1 represents a simplified example, and that the number of placement regions (movebounds) and the number of placeable objects may vary considerably and especially may be much larger. While the depicted regions are all rectangular, the present invention is not limited to any shape for the constraint regions, and they could for example be L-shaped or Z-shaped, or even more complicated shapes. The physical sizes of the regions also are not necessarily larger for regions that have more objects. As explained in more detail further below, the present invention may provide different scheduling algorithms based on the specific object and movebound characteristics of the integrated circuit design to be placed.

Figure 2:
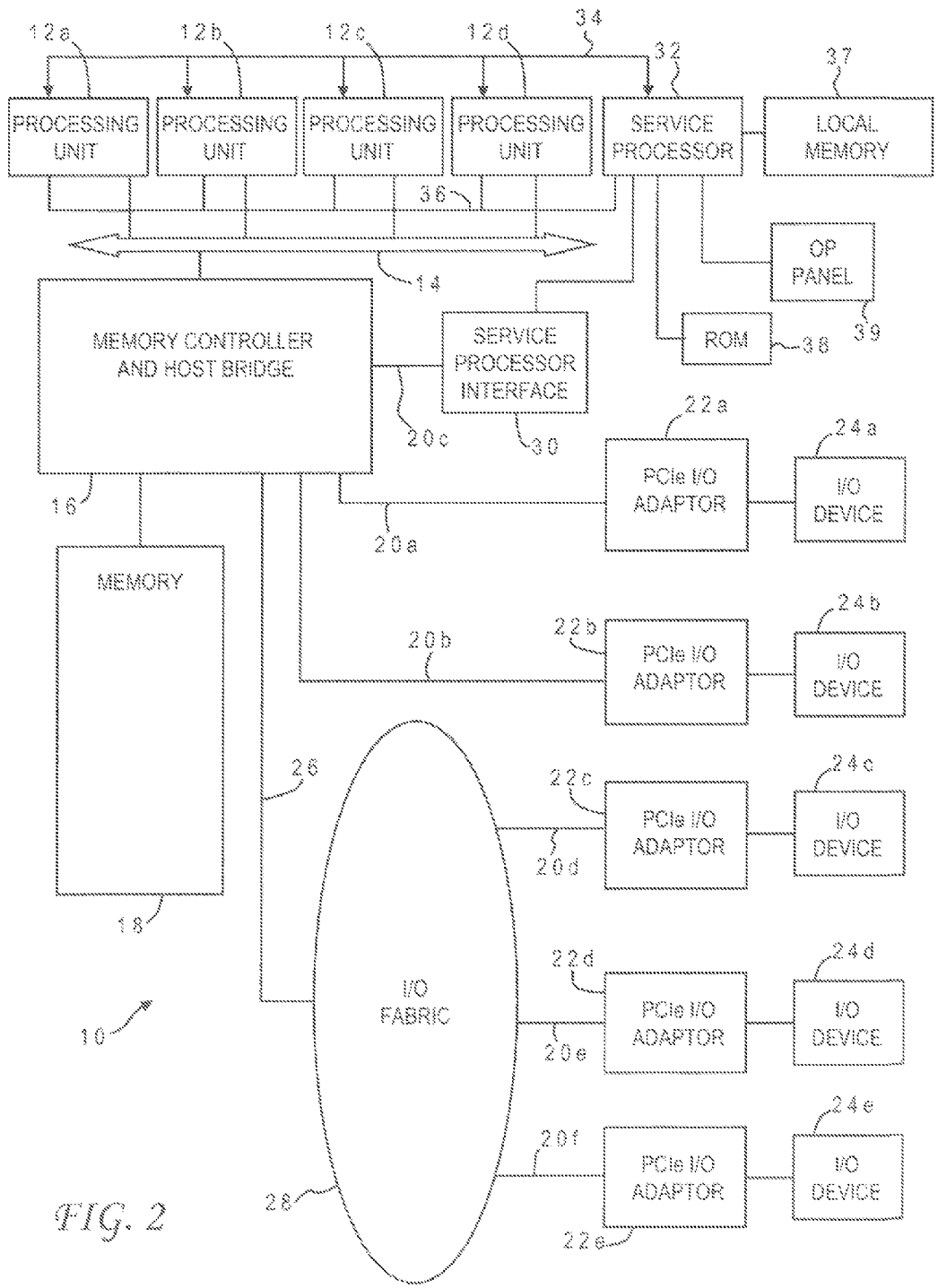
FIG. 2 is a block diagram of a multiprocessor computer system programmed to carry out scheduling for parallel processing of regionally-constrained placement in accordance with one implementation of the present invention.

With further reference to FIG. 2, there is depicted one embodiment 10 of a multiprocessor computer system in which the present invention may be implemented to carry out processor scheduling for regionally-constrained placement. Computer system 10 is a symmetric multiprocessor (SMP) system having a plurality of computational processors 12a, 12b, 12c, 12d connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe)link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices; an optical disk drive, and a network card. Each PCIe adaptor provides an interface between the PCI link and the respective I/O device. MC/HB 16 provides a low latency path through which processors 12a, 12b, 12c, 12d may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is non-computational in the sense that it carries out only supervisory functions and not the basic function of processing application program instructions. Service processor 32 is connected to computational processors 12a, 12b, 12c, 12d via a JTAG interface 34, and uses an attention line 36 which interrupts the operation of processors 12a, 12b, 12c, 12d. Each processor 12a, 12b, 12c, 12d is assigned a unique processor identification number (ID) for these communications and to facilitate parallel processing of placement program instructions. Service processor 32 may have its own local memory 37 and is connected to read-only memory (ROM) 38 which stores various program instructions for system startup. Service processor 32 may also have access to a hardware operator panel 39 to provide system status and diagnostic information.

In alternative embodiments computer system 10 may include modifications of these hardware components or their interconnections, or additional components, so the depicted example should not be construed as implying any architectural limitations with respect to the present invention. In particular computer system may have more or less than four computational processors (in addition to any service processors). The computer system may also be a distributed computing system with host processors at different locations communicating via a network.

When computer system 10 is initially powered up, service processor 32 uses JTAG interface 34 to interrogate the system (host) processors 12a, 12b, 12c, 12d and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 39. If a valid configuration of system resources is still possible after taking out any components found to be faulty during the testing then computer system 10 is allowed to proceed. Executable code is loaded into memory 18 and service processor 32 releases host processors 12a, 12b, 12c, 12d for execution of the program code, e.g., an operating system (OS) which is used to launch applications including the scheduling program of the present invention as well as conventional placement algorithms, results of which may be stored in a hard disk drive of the system (an I/O device 24). While the host processors are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, 12c, 12d memory 18, and MC/HB 16. Service processor 32 may take further action based on the type of errors or defined thresholds.

While the illustrative implementation provides program instructions embodying the present invention on disk drive 36, those skilled in the art will appreciate that the invention can be embodied in a program product utilizing other computer-readable media. The program instructions may be written in the C++ programming language for an AIX environment. Computer system 10 carries out program instructions for a scheduling process that uses novel balancing techniques to assign computational loads for placement of objects within constraint regions for the physical design of an integrated circuit. Accordingly, a program embodying the invention may include conventional aspects of various placement and other EDA tools, and these details will become apparent to those skilled in the art upon reference to this disclosure.

The objective of the parallelization scheme in a placement flow for regionally-constrained designs according to the present invention is to balance the total run time among all processors, which is equivalent to minimizing the maximum run time (also referred to as time-span). The run time of each processor ($RT_i$) can be decomposed into two additive components: the useful run time needed to process all assigned regions ($U_i$) which is proportional to the number of objects attached to those regions, and the run time associated with the context switching overhead ($O_i$) between regions assigned to a given processor ($P_i$). The goal is thus to minimize max($RT_i$). The optimal solution to this minimization problem depends on the particular object and movebound characteristics of the subject integrated circuit design. If the design has a fairly small number of movebounds, $O_i$ becomes negligible and the optimal approach is based on balancing the number of objects amongst the computational processors. If the design has a larger number of movebounds but the average number of objects per movebound is still relatively small, $U_i$ becomes negligible and the optimal approach is based on balancing the number of movebounds amongst the computational processors. If there are a large number of movebounds and a large number of objects in most movebounds, neither $U_i$ nor $O_i$ are negligible and the optimal approach is based on balancing both the number of movebounds and the number of objects amongst the computational processors.

Figure 3:
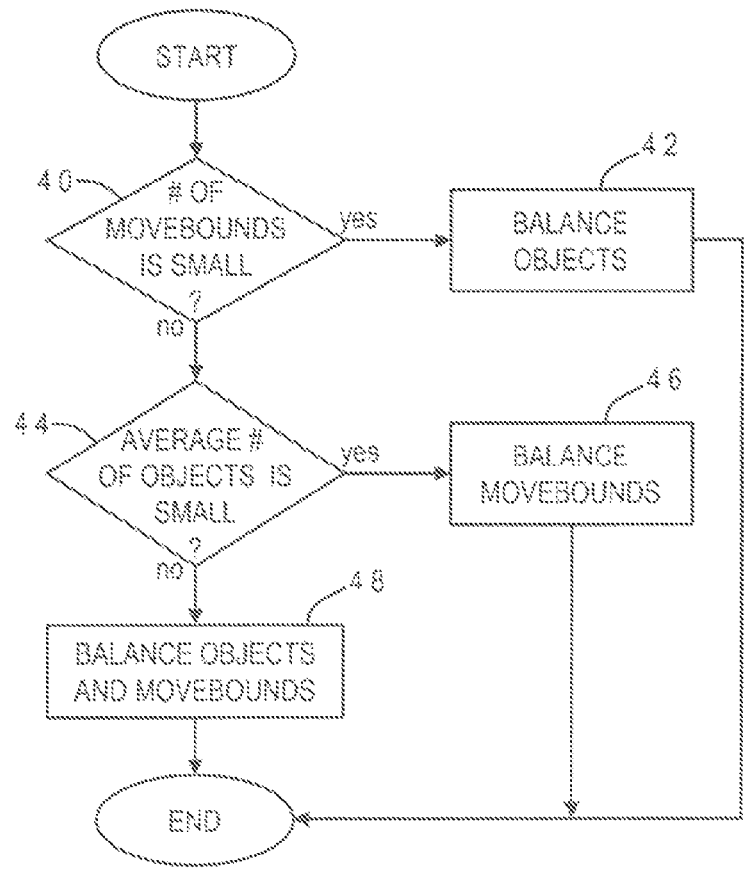
FIG. 3 is a flow chart illustrating the use of different scheduling algorithms based on the particular object and movebound characteristics of the integrated circuit design to be placed in accordance with one implementation of the present invention.

Accordingly, at the highest level the present invention may first undertake the determinations illustrated in the flow chart of FIG. 3 by executing appropriate program instructions in computer system 10. The number of movebounds in the design is first compared to a threshold number of movebounds (40). If the number of movebounds is less than this threshold, the scheduling is selectively performed using an algorithm which distributes movebound computational loads based on the number of objects without regard to the number of movebounds (42). If the number of movebounds is large, the average number of objects per movebound is then compared to a threshold number of objects per movebound (44). If the average number of objects per movebound is less than this threshold, the scheduling is selectively performed using an algorithm which distributes movebound computational loads based on the number of movebounds without regard to the number of objects (46). Both of these thresholds are predetermined by the designer, and for example may be around 10 movebounds and around 5 objects per movebound. If both of these comparisons have negative results, the scheduling is selectively performed using an algorithm which distributes movebound computational loads based on both the number of movebounds and the number of objects (48). The appropriate balancing scheme is thus automatically applied according to the design characteristics.

The flow of FIG. 3 is in accordance with one specific implementation of the present invention and other implementations may make these determinations in different order or based on different parameters associated with the numbers of objects and movebounds. Once scheduling is complete using the particular balancing algorithm, computer system 10 may carry out the parallelized placement of the circuit objects using any conventional placement routine in accordance with the generated schedule. Details of such placement routines are beyond the scope of this invention but will become apparent to those skilled in the art.

Balancing the number of movebounds (46) is a straightforward calculation. In this situation the ideal number of movebounds assigned to a given processor is equal to the total number of movebounds in the design divided by the total number of processors (either truncated or rounded up depending upon implementation). Computational loads for the movebounds are assigned to a given processor in no particular order until the number of movebounds for that processor is equal to or greater than the ideal number of movebounds. Movebound load assignment then proceeds to the next processor, until all movebound loads have been assigned.

In the illustrative embodiment, balancing the number of objects (42) is accomplished by looping through the processors and assigning movebound loads until an amortized number of objects assigned to a given processor is more than an ideal number of objects or more than some limit above the ideal number of objects. One implementation for balancing objects is illustrated by the flow chart of FIG. 4, in which the scheduling process begins by receiving the list of movebounds and objects (50). The list may be derived by a top-level floor planning tool from a netlist or other circuit description for the integrated circuit design, and includes the associations for each object to a given movebound. The ideal number of objects per processor is then calculated as the total number of objects divided by the total number of processors, truncated or rounded up (52). A processor counter i is initialized at a value of 1 (54). The next movebound is assigned to processor $P_i$ (56). Of course, for the first pass the "next" movebound is the first movebound in the list of movebounds (with no particular order), which is assigned to the first processor $P_1$. So long as there are more movebounds to be assigned (58), the process continues by checking whether the amortized number of objects is more than 20% above the ideal number of objects per processor (60). The amortized number of objects is the total number of objects in all movebounds whose computational loads have already been assigned to the current processor. If the amortized number of objects is not greater than the +20% threshold, the current processor probably has room for more objects, i.e., another movebound. However, it may be possible that the next movebound assignment to the current processor will raise the amortized number of objects greatly above the ideal number, so another check is performed to determine whether the next assignment would result in an object overflow greater than 70% of the ideal number of objects per processor (62). If not, the process goes back to box 56 and assigns the next movebound to the current processor. If the next assignment would result in an overflow greater than 70% of the ideal number, the processor counter i is incremented (64) so that the next movebound is assigned to the next processor in the list of processors (56). Returning to box 60, if the amortized number of objects for the current is greater than 20% after any movebound assignment, the processor counter is again incremented (64) and the process continues with the next movebound assignment to the next processor (56). Once all movebounds have been assigned the scheduling process is complete, and the schedule may be stored in system memory for use in the subsequent placement processing (66).

The foregoing implementation is a static mode for an object balancing algorithm, but the invention may alternatively be implemented in an adaptive mode wherein the ideal number of objects per processor is updated before advancing to the next processor (68). The ideal number of objects per processor is updated by dividing the number of remaining objects (i.e., those objects in movebounds whose loads have not yet been assigned) by the number of available processors (i.e., those processors which have not yet received any movebound assignments).

Figure 4:
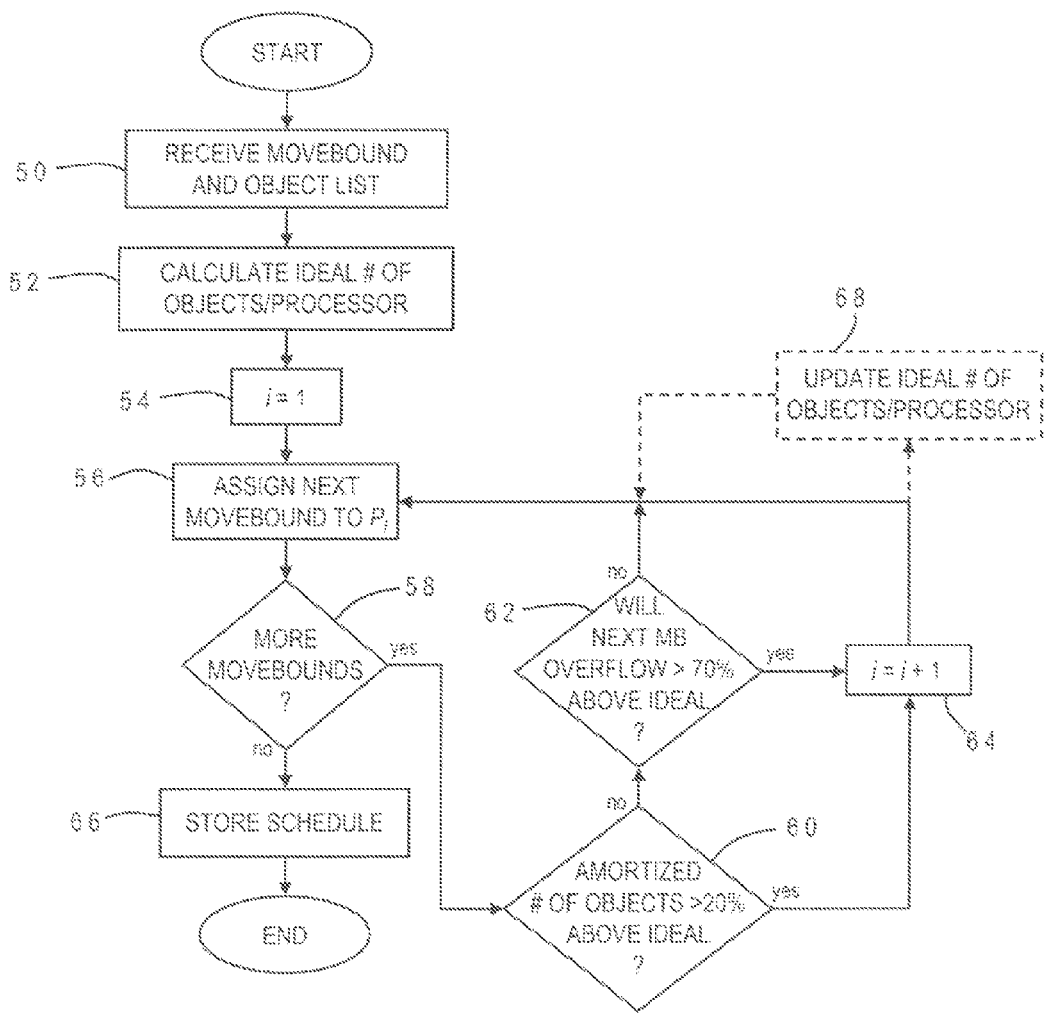
FIG. 4 is a flow chart illustrating the assignment of movebound loads to processors while balancing the number of placeable objects in accordance with one implementation of the present invention.
Figure 5:
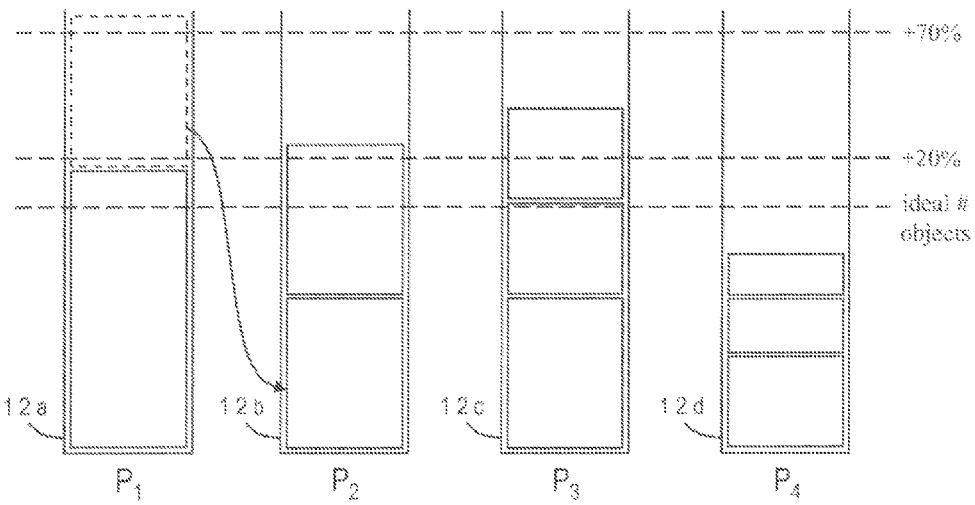
FIG. 5 is a pictorial representation of the movebound assignment process of FIG. 4 applied to four different processors.

FIG. 5 is a pictorial representation of an exemplary movebound load schedule resulting from the object balancing process of FIG. 4. In this simplified example there are nine movebounds whose computational loads have been assigned to four processors in the order $P_1$, $P_2$, $P_3$, $P_4$. When the first movebound is assigned to the first processor $P_1$, the amortized number of objects does not quite exceed the +20% threshold above the ideal number of processors. However, assignment of the second movebound to processor $P_1$ would result in an overflow of more than 70% above the ideal number, so the movebound assignment for processor $P_1$ is deemed complete, and the second movebound is instead assigned to the second processor $P_2$. Assignment of only the second movebound to processor $P_2$ creates an object load that is much less than +20% threshold. Consequently the third movebound is also assigned to the second processor $P_2$ which then leads to an amortized number of objects that is slightly higher than the +20% threshold, after which movebound assignment for processor $P_2$ is deemed complete. The next three movebounds are assigned to processor $P_3$ until the amortized number of objects is again above the +20% threshold. The last three movebounds are then assigned to the last processor $P_4$, even though the total object load on processor $P_4$ ends up being less than the ideal number of objects per processor.

Balancing both the number of movebounds and the number of objects (48) is more problematic. The present invention finds it useful to define the objective as partitioning a set of N items ($a_0, \ldots, a_{N-1}$) into M subsets $P_0, \ldots, P_{M-1}$ so that $\Sigma_i \Sigma_i (L_i - L_j)^2$ is minimized (a balanced load), subject to a balanced cardinality constraint $|C_i - C_j| \leq 1$, where $L_i$ is the total number of objects assigned to $P_i$ (i.e., the object size of the movebounds) and $C_i$ is the number of movebounds assigned to $P_i$. This objective properly takes into consideration both $U_i$ (the total number of objects) and $O_i$ (the total number of movebounds). The present invention recognizes that this objective may be attained by utilizing an algorithm which sorts the movebounds based on the number of objects in each movebound, and then assigns the sorted movebounds to the processors in successive rounds while flipping the order of processor assignment after each round.

Figure 6:
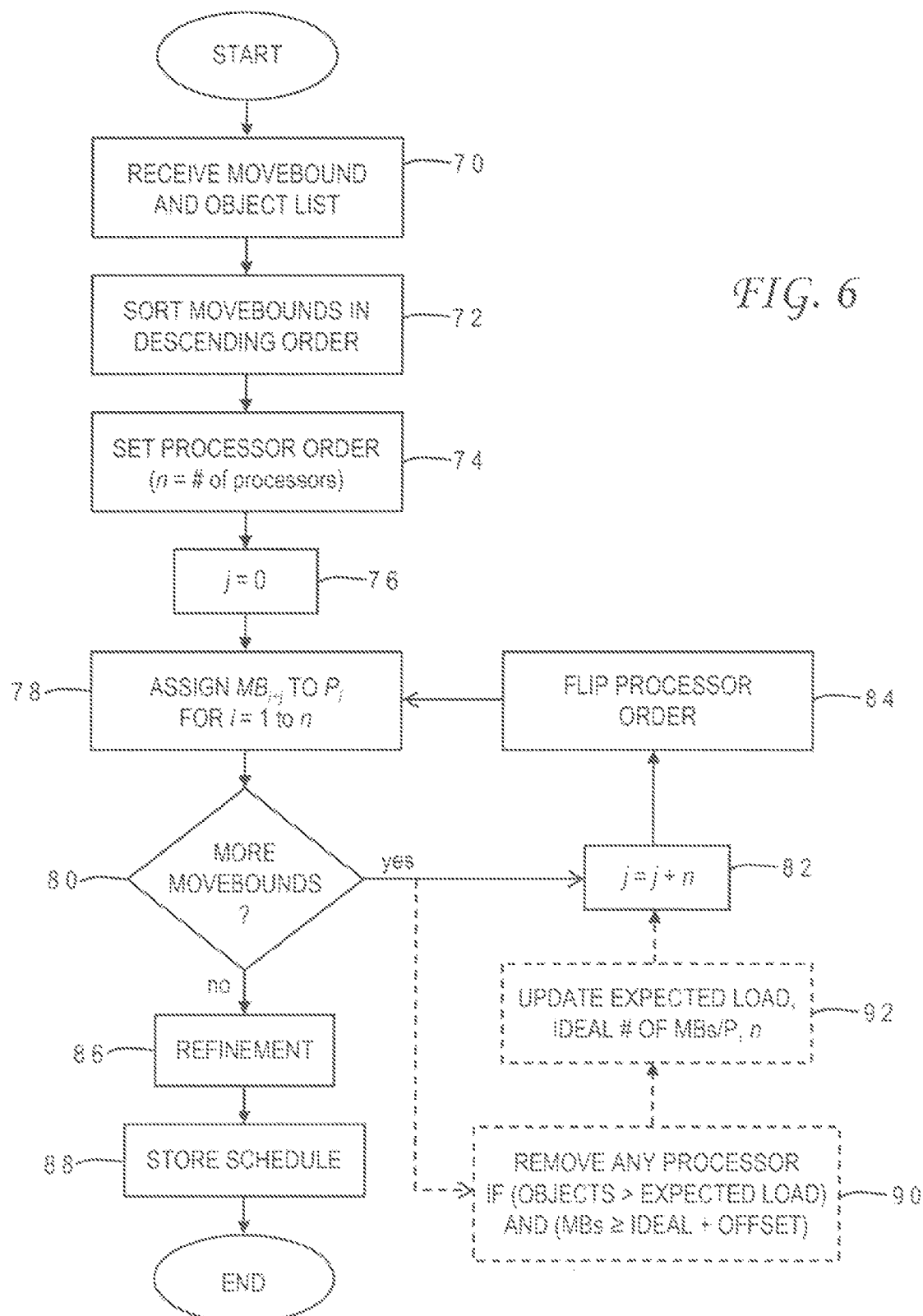
FIG. 6 is a flow chart illustrating the assignment of movebound loads to processors while balancing the number of placeable objects and movebounds in accordance with another implementation of the present invention.

One implementation for balancing both objects and movebounds is illustrated by the flow chart of FIG. 6, in which the scheduling process again begins by receiving the list of movebounds and objects (70). The movebounds are sorted based on the number of objects in each movebound (72). Although the sorting could be in ascending order, it is preferable to sort by descending order, viz., the first movebound in the order is a movebound with the largest number of objects (the biggest movebound). A processor order is also set (74). For example, if there are four processors, the processor order for the initial round may be designated as $P_1$, $P_2$, $P_3$, $P_4$ using the unique processor IDs. A round counter j is initialized at value 0 (76). Movebounds are then assigned to the processors, one movebound per processor for each of the n processors, in the descending order (78). So long as there are more movebounds after a given round of assignments (80), the round counter is incremented (82) and the processor order is reversed (84) for the next round of assignments. Continuing with the foregoing example, the order of the processors for the second (and subsequent even-numbered rounds) is $P_4$, $P_3$, $P_2$, $P_1$, with the movebounds still being assigned in descending order. The process then continues at box 78 with additional movebound assignments, flipping the processor order after each round such that the original order of $P_1$, $P_2$, $P_3$, $P_4$ is restored for subsequent odd-numbered rounds. In this manner, the invention prevents the same processor from being populated each round with the largest movebound assigned that round. The alternating processor order thus helps to maintain a more balanced load, and ensures that the final cardinality difference (number of regions assigned) between any two processors is less than or equal to 1. Once all of the movebounds have been assigned, the process may be considered complete, but in this implementation it preferably continues with a refinement procedure discussed further below in conjunction with FIG. 8 (86). After refinement, the schedule may be stored in system memory for use in the subsequent placement processing (88).

The foregoing implementation is a static mode for an object and movebound balancing algorithm, but the invention may alternatively be implemented in an adaptive mode wherein a processor is removed from consideration for further movebound assignment if it meets certain load criteria. In the illustrative embodiment for this adaptive mode, a processor is removed if (i) the number of objects in all movebounds already assigned to it is more than an expected object load per processor, and (ii) the number of movebounds already assigned to the processor at this stage is not more than an predetermined offset away from an ideal number of movebounds per processor (90). The expected load per processor may be calculated as the total number of objects attached to the movebounds which are not yet assigned to a processor divided by the number of processors whose load is less than the current expected load. In the first round the expected load is equal to the ideal load which may be calculated as the total number of objects divided by the total number of processors. The ideal number of movebounds per processor may be calculated as total number of movebounds divided by the number of processors. The offset may for example be on the order of 10 movebounds, and may be adjusted by the designer to tune the refinement. After removing any processor meeting these criteria, the expected load and ideal number of movebounds per processor is dynamically recalculated (92). The check for processor removal is preferably performed after a round of assignments is complete, but it can alternatively be performed after each movebound assignment.

Figure 7:
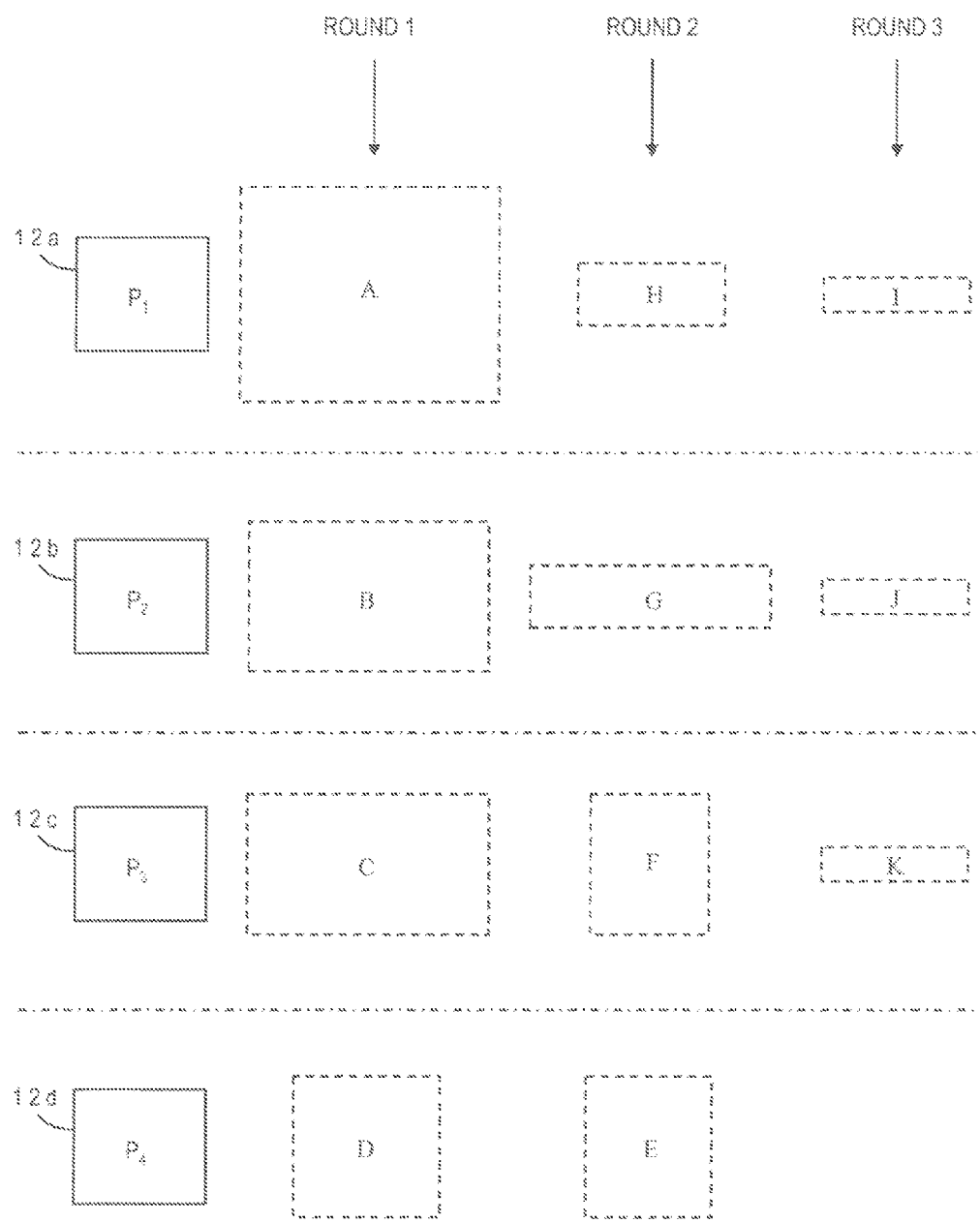
FIG. 7 is a pictorial representation of the movebound assignment process of FIG. 6 using the movebounds of FIG. 1 applied to four different processors.

FIG. 7 is a pictorial representation of an exemplary movebound load schedule resulting from the object balancing process of FIG. 6. In this simplified example the eleven movebounds from the integrated circuit design of FIG. 1 have been assigned to four processors $P_1$, $P_2$, $P_3$, $P_4$. The movebounds are identified in FIG. 1 with capital letters to designate the order according to object size, i.e., movebound A is the largest movebound and movebound K is the smallest movebound. FIG. 6 depicts how these eleven movebounds are assigned to the four processors in three rounds. In the first round, the four largest movebounds A, B, C, D are respectively assigned in that order to processors $P_1$, $P_2$, $P_3$, $P_4$. The processor order is then reversed for the second round so that the next four largest movebounds E, F, G, are respectively assigned in that order to processors $P_4$, $P_3$, $P_2$, $P_1$. For the last round only three movebounds I, J, K remain, and they are respectively assigned in that order to processors $P_1$, $P_2$, $P_3$.

Figure 8:
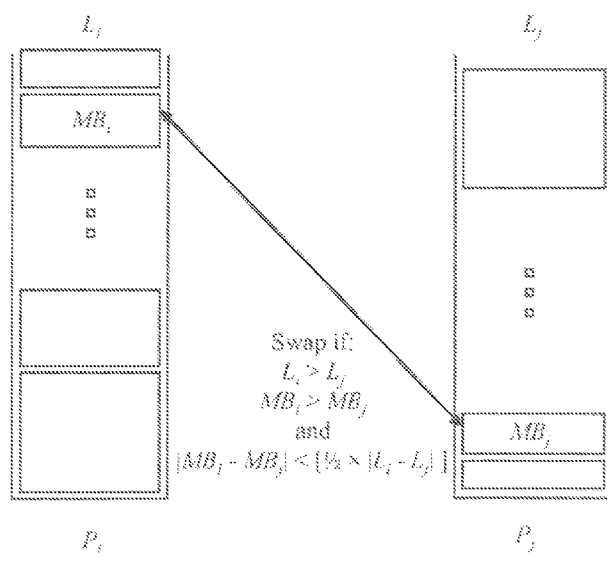
FIG. 8 is a pictorial representation of a refinement phase for movebound assignment in accordance with one implementation of the present invention.

The foregoing techniques result in schedules that are fairly balanced but may still allow for some improvement, particularly when two processors have different cardinality and the one with more movebounds also has a greater object load. The invention may advantageously refine the schedule further in such cases, and one approach for refinement is shown in FIG. 8. One processor. $P_i$ has an object load $L_i$ while another processor $P_j$ has an object load $L_j$. For any such pair of processors where $L_i > L_j$, a given movebound $MB_i$ in processor $P_i$ will be swapped with a given movebound $MB_j$ in processor $P_j$ if and only if $MB_i > MB_j$, and $|MB_i - MB_j| < [-\frac{1}{2} \times |L_i - L_j|]$. The predetermined weighting factor of "½" is exemplary and may be adjusted by the designer. This refinement may conveniently be implemented by sorting the processors according to their object loads in descending order, and then looping through the movebounds assigned to a bigger load processor in descending order of movebound size while traversing through the movebounds assigned to the smaller load processor in increasing order of movebound size.

Runtime for this balancing scheme includes three primary contributors: the sorting phase, the assignment flipping phase, and the refinement phase. Sorting the movebounds has a time complexity of $O(N \log N)$, and the flipping assignment has a time complexity of $O(N)$, where N is the total number of movebounds. Time complexity for the refinement phase is $O(N^2)$ in worst case, but for designs having a large number of movebounds the time complexity reduces to $O(N)$ as a result of perfect match scenarios. The present invention thus provides a near-optimal solution without adding significant overhead runtime. Experiments with a variety of circuit designs indicate significant speed-up in overall turn-around time compared to prior art scheduling techniques without any degradation in the quality of result.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A computer-implemented method for scheduling parallel processing of computational loads for constraint regions of an integrated circuit design having associated placeable objects among a plurality of host processors of a computer system, comprising:
first comparing a total number of the constraint regions in the design to a threshold number of regions by executing first instructions in the computer system;
second comparing an average number of placeable objects per constraint region to a threshold number of objects per region by executing second instructions in the computer system; and
based on said first comparing and said second comparing, selectively distributing placement computations for the constraint regions to different host processors of the computer system by (i) executing third instructions in the computer system to balance the constraint regions amongst the host processors without regard to the placeable objects, (ii) executing fourth instructions in the computer system to balance the placeable objects amongst the host processors without regard to the constraint regions, or (iii) executing fifth instructions in the computer system to balance both the placeable objects and the constraint regions amongst the host processors.

2. The method of claim 1 wherein the placeable objects are balanced amongst the host processors without regard to the constraint regions when the total number of constraint regions is less than the threshold number of regions.

3. The method of claim 2 wherein the placeable objects are balanced amongst the host processors by:
calculating an ideal number of objects per processor;
successively assigning one or more of the constraint regions to a given host processor until either (i) an amortized number of objects for the given host processor exceeds 120% of the ideal number of objects per processors, or (ii) a next constraint region assignment to the given host processor would cause the amortized number of objects for the given host processor to exceed 170% of the ideal number of objects per processors; and
iteratively repeating said successively assigning one or more of the constraint regions to each next host processor in the computer system.

4. The method of claim 1 wherein the constraint regions are balanced amongst the host processors without regard to the placeable objects when the average number of placeable objects per constraint region is less than the threshold number of objects per region.

5. The method of claim 4 wherein the constraint regions are balanced amongst the host processors by assigning to each host processor an ideal number of the constraint regions which is equal to the total number of constraint regions in the design divided by the total number of host processors in the computer system.

6. The method of claim 1 wherein both the constraint regions and the placeable objects are balanced amongst the host processors when the total number of constraint regions is greater than or equal to the threshold number of regions and the average number of placeable objects per constraint region is greater than or equal to the threshold number of objects per region.

7. The method of claim 6 wherein the constraint regions and the placeable objects are balanced amongst the host processors by:
sorting the constraint regions in descending order according to the number of placeable objects in each constraint region; and
assigning the constraint regions in the descending order to the host processors in successive rounds while flipping an assignment order of the host processors after each round.

* * * * *